United States Patent
Scheuerlein

(10) Patent No.: US 6,735,104 B2
(45) Date of Patent: *May 11, 2004

(54) MEMORY DEVICE WITH ROW AND COLUMN DECODER CIRCUITS ARRANGED IN A CHECKERBOARD PATTERN UNDER A PLURALITY OF MEMORY ARRAYS

(75) Inventor: Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/440,377

(22) Filed: May 16, 2003

(65) Prior Publication Data

US 2003/0202404 A1 Oct. 30, 2003

Related U.S. Application Data

(63) Continuation of application No. 09/896,814, filed on Jun. 29, 2001, now Pat. No. 6,567,287.
(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.$^7$ ................................................. G11C 5/02
(52) U.S. Cl. ...................... 365/51; 365/53; 365/230.03; 365/230.06
(58) Field of Search ........................ 365/51, 53, 230.03, 365/230.06, 63

(56) References Cited

U.S. PATENT DOCUMENTS

| | | |
|---|---|---|
| 4,646,266 A | 2/1987 | Ovshinsky et al. |
| 5,293,342 A | 3/1994 | Casper et al. |
| 5,717,650 A | 2/1998 | Chung et al. |
| 5,751,012 A | 5/1998 | Wolstenholme et al. |
| 5,835,396 A | 11/1998 | Zhang |
| 5,898,637 A | 4/1999 | Lakhani et al. |
| 5,986,938 A | 11/1999 | Jang |
| 6,034,882 A | 3/2000 | Johnson et al. |
| 6,055,180 A | 4/2000 | Gudesen et al. |
| 6,185,121 B1 | 2/2001 | O'Neill |

OTHER PUBLICATIONS

Mohsen et al., "The Design and Performance of CMOS 256K Bit DRAM Devices," IEEE Journal of Solid–State Circuits, vol. SC–19, No. 5, pp. 610–618 (Oct. 1984).
Kawamoto et al., "A 288K CMOS Pseudostatic RAM," IEEE Journal of Solid–State Circuits, vol. SC–19, No. 5, pp. 619–623 (Oct. 1984).
Naji et al., "A 256kb 3.0V 1T1MTJ Nonvolatile Magnetoresistive RAM," Digest of Technical Papers of the 2001 IEEE International Solid–State Circuits Conference, ISSCC 2001/Session 7/Technology Directions: Advanced Technologies/7.6, 2 pages (Feb. 6, 2001).
Naji et al., "A 256kb 3.0V 1T1MTJ Nonvolatile Magnetoresistive RAM," ISSCC 2001 Visual Supplement, pp. 94–95, 404–405 (2001).

*Primary Examiner*—Hoai Ho
(74) *Attorney, Agent, or Firm*—Brinks Hofer Gilson & Lione

(57) ABSTRACT

The preferred embodiments described herein provide a memory device with row and column decoder circuits arranged in a checkerboard pattern under a plurality of memory arrays. In one preferred embodiment, a memory device is provided with its row decoder circuits and column decoder circuits arranged in a checkerboard pattern under a plurality of memory arrays. Because each of the row decoder and column decoder circuits is associated with the memory array above its location and an adjacent array, a denser support circuit arrangement is provided as compared to prior approaches. Other preferred embodiments are provided, and each of the preferred embodiments described herein can be used alone or in combination with one another.

51 Claims, 8 Drawing Sheets

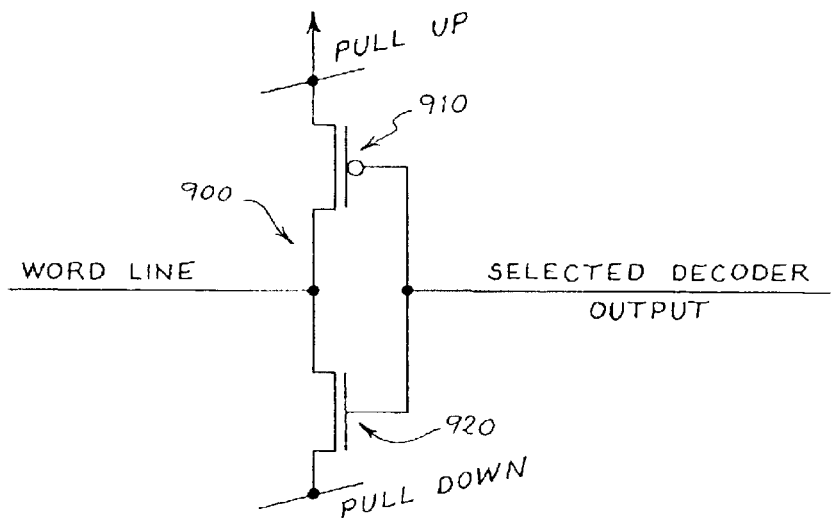

WORD LINE VOLTAGE CONTROL

| | | PULL UP (A) | PULL DOWN (A) | PULL UP (B) | PULL DOWN (B) | PULL UP (C) | PULL DOWN (C) | PULL UP (D) | PULL DOWN (D) |
|---|---|---|---|---|---|---|---|---|---|
| FOR SELECTED DECODER | WL1 | $V_p$ | DON'T CARE | NO CONNECTION NC | NC | NC | NC | NC | NC |
| | WL2 | NC | NC | $V_u$ | DON'T CARE | NC | NC | NC | NC |
| | WL3 | NC | NC | NC | NC | FLOAT | DON'T CARE | NC | NC |
| | WL4 | NC | NC | NC | NC | NC | NC | FLOAT | DON'T CARE |
| FOR ALL UNSELECTED DECODERS | WL5, 6,7,8 | DON'T CARE | $V_u$ | DON'T CARE | $V_u$ | DON'T CARE | FLOAT | DON'T CARE | FLOAT |

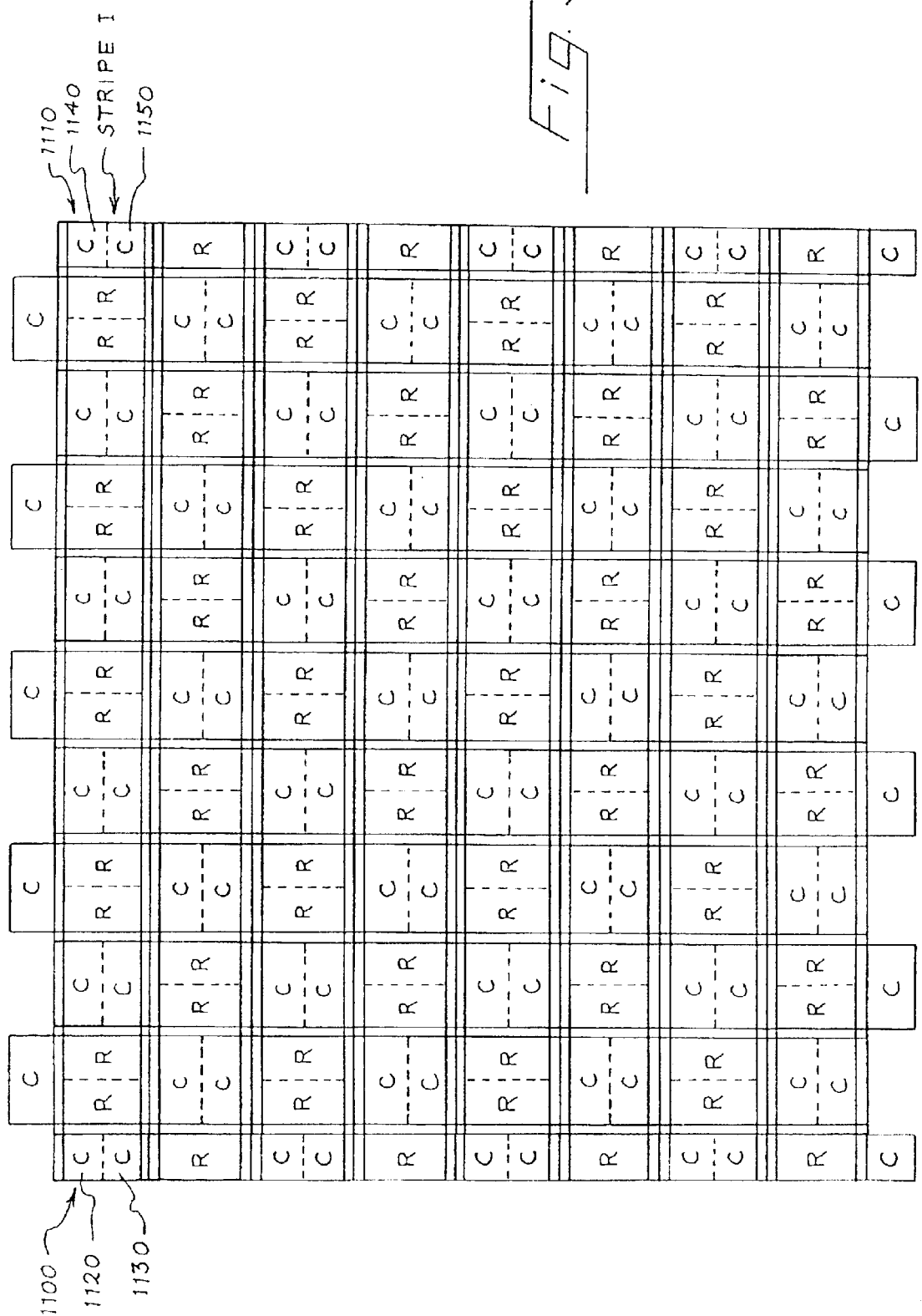

MEMORY DEVICE WITH ROW AND COLUMN DECODER CIRCUITS ARRANGED IN A CHECKERBOARD PATTERN UNDER A PLURALITY OF MEMORY ARRAYS

CROSS-REFERENCE TO RELATED APPLICATIONS

This application is a continuation of U.S. patent application Ser. No. 09/896,814, filed Jun. 29, 2001 now U.S. Pat. No. 6,567,287, which claims the benefit of the following U.S. provisional applications, each of which was filed on Mar. 21, 2001: U.S. Provisional Application No. 60/277,794; U.S. Provisional Application No. 60/277,815; and U.S. Provisional Application No. 60/277,738. Each of the above-referenced applications is hereby incorporated by reference.

BACKGROUND

Unlike memory cells of two-dimensional memory arrays, memory cells of vertically-stacked memory arrays are built above, rather than in, a planar substrate. These memory cells can be stacked vertically in numerous layers to form a three-dimensional array, as described in U.S. Pat. No. 6,034,882 to Johnson et al. The support circuits for vertically-stacked memory cells, such as row and column decoder circuits and wordline and bitline drivers, are on the surface of the substrate. While the support circuits can also be built above the substrate, the process complexity associated with stacking support circuits is currently too high for economical manufacturing. As a result, for very dense memory arrays, the support circuits occupy a very large percentage of the memory chip area. For example, support circuits can occupy half the area of a planar memory chip and an even larger percentage of a three-dimensional memory array stacked in 16 layers, even though the stacked memory cells occupy $1/16$ the area of conventional planar memory.

Several approaches have been described to provide a denser support circuit arrangement to obtain a smaller memory chip area. In an approach used with vertically-stacked memory arrays, row and/or column decoder circuits are disposed directly under the memory arrays to help minimize the fraction of the memory chip area not devoted to memory cells. This approach is described in U.S. Pat. No. 6,034,882 to Johnson et al. In an approach used with conventional two-dimensional memory arrays where support circuits are next to (but not below) the memory cells, row and column decoder circuits are shared between adjacent memory arrays. That is, the support circuits are associated with memory arrays on two sides of the support circuits but not above the support circuits. This approach is described in "The Design and Performance of CMOS 256 K Bit DRAM Devices" (see FIG. 3) and "A 288 K CMOS Pseudostatic RAM" (see FIG. 3) in the IEEE Journal of Solid-State Circuits, Vol. SC-19, No. 5 (October 1984). With this approach, four times the number of memory arrays, for example, results in two times (not four times) the number of support circuits.

There is a need for a memory device with a denser support circuit arrangement.

SUMMARY

The present invention is defined by the following claims, and nothing in this section should be taken as a limitation on those claims.

By way of introduction, the preferred embodiments described below provide a memory device with row and column decoder circuits arranged in a checkerboard pattern under a plurality of memory arrays. In one preferred embodiment, a memory device is provided with its row decoder circuits and column decoder circuits arranged in a checkerboard pattern under a plurality of memory arrays. Because each of the row decoder and column decoder circuits is associated with the memory array above its location and an adjacent array, a denser support circuit arrangement is provided as compared to prior approaches. Other preferred embodiments are provided, and each of the preferred embodiments described herein can be used alone or in combination with one another.

The preferred embodiments will now be described with reference to the attached drawings.

BRIEF DESCRIPTION OF THE DRAWINGS

FIG. 9 is an illustration of a switch of a preferred embodiment

FIG. 10 is a table illustrating wordline voltage control of a preferred embodiment.

FIG. 11 is an illustration of a preferred embodiment that has partial capacity memory arrays at the ends of the stripes of memory arrays.

DETAILED DESCRIPTION OF THE PRESENTLY PREFERRED EMBODIMENTS

Figure 1:
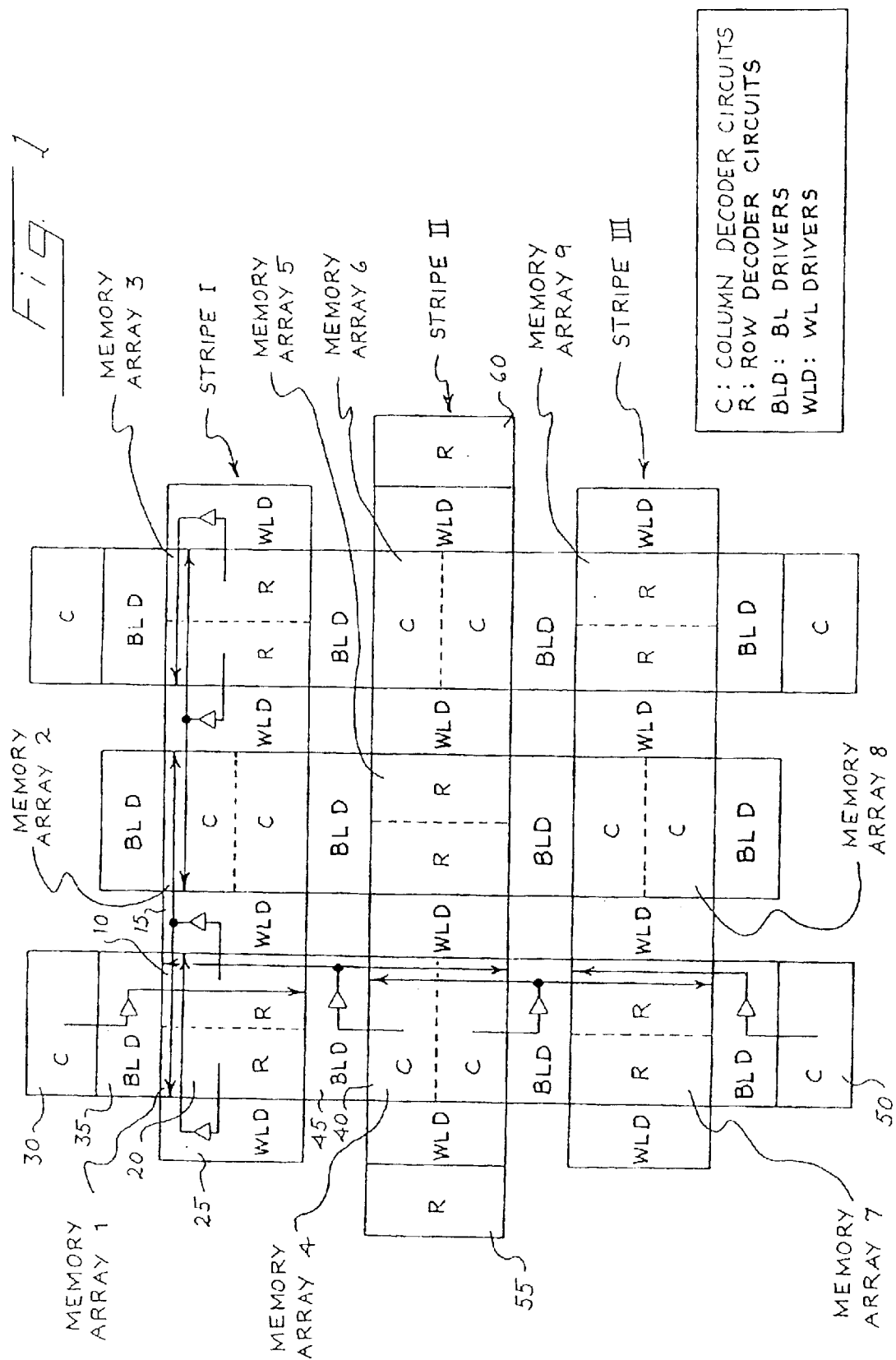
FIG. 1 is an illustration of a memory circuit arrangement of a preferred embodiment.
Figure 2:
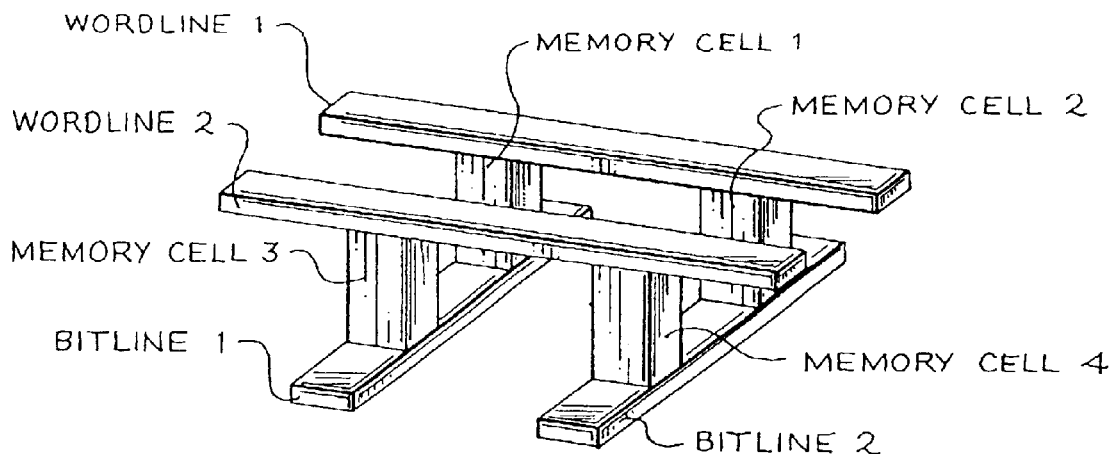
FIG. 2 is an illustration of memory cells, wordlines, and bitlines of a preferred memory array.

Turning now to the drawings, FIG. 1 is an illustration of a memory circuit arrangement of a preferred embodiment. In this preferred embodiment, a plurality of memory arrays (memory arrays 1–9) are arranged in a three-by-three grid. Each memory array comprises a plurality of memory cells built above a planar substrate. While only one level of memory cells is shown in FIG. 1 to simplify the drawing, memory cells can be stacked vertically in numerous layers to form a three-dimensional memory array. As shown in FIG. 2, each memory cell is preferably a two-terminal cell, with each of the terminals in electrical contact with a respective conductor. The term "terminal" is intended broadly, and a terminal may be embodied simply as a terminal portion of the cell or as a separate layer of the cell. The conductors at one terminal are wordlines, and the conductors at the other terminal are bitlines. Accordingly, each memory cell bridges one wordline and one bitline, and its location in the array is with respect to an intersection of a wordline and a bitline. For example, memory cell 1 bridges wordline 1 and bitline 1, while memory cell 4 bridges wordline 2 and bitline 2. It should be noted that the memory cell can be a physically-discrete element as shown in FIG. 2 or can be defined by rail-stacks and intermediate layers, as described in U.S. patent application Ser. No. 09/638,428, which is hereby incorporated by reference. Further, the memory cell can take the form of a write-once memory cell or a re-writeable memory cell.

In this embodiment, each array is associated with two wordline drivers, two bitline drivers, and two sets of row decoder circuits and column decoder circuits. Splitting the drivers and decoder circuits in half is preferred when the memory cell pitch in very tight. With reference to memory array 1, wordline (WL) drivers 25 activate the even-numbered wordlines and are driven by row decoder circuits 20, while wordline drivers 15 activate the odd-numbered wordlines and are driven by the other of the pair of row decoder circuits (row decoder circuits 10). Similarly, bitline (BL) drivers 35 activate the even-numbered bitlines and are driven by column decoder circuits 30, while bitline drivers 45 activate the odd-numbered bitlines and are driven by column decoder circuits 40. As shown in memory array 1 in FIG. 1, this results in interleaved bitlines and wordlines. (To simplify the drawing, only some of the bitlines and wordlines are shown.) If larger memory cells are used, it may be preferred not to interleave the bitlines and/or wordlines. This provides the advantage of removing half of the line connections.

To select a memory cell in memory array 1, a row address is provided to the row decoder circuits 10, 20, and a column address is provided to the column decoder circuits 30, 40. The row decoder circuits 10, 20 and the column decoder circuits 30, 40 determine which wordline and bitline correspond to the provided row and column address. The output of the row decoder circuits 10, 20 and the column decoder circuits 30, 40 drives the wordline drivers 15, 25 and the bitline drivers 35, 45 to read from or write into the selected memory cell. In one preferred embodiment, the column decoder circuits comprise address decoding circuitry and a sense amplifier for reading data from a selected bitline. The column decoder circuits can also include write driver circuitry for write operations and I/O interface circuitry for I/O bus lines.

In this preferred embodiment, the row decoder circuits and the column decoder circuits are arranged in a checkerboard pattern under the plurality of memory arrays. That is, the row decoder circuits and the column decoder circuits are arranged under multiple arrays of memory cells in alternating locations as in a checkerboard pattern: memory arrays 1, 3, 5, 7, and 9 are disposed over row decoder circuits, and memory arrays 2, 4, 6, and 8 are disposed over column decoder circuits. Each of the row decoder circuits and column decoder circuits is associated with (i.e., is shared between or supports) the memory array above its location and an adjacent memory array (i.e., "its neighbor"). For example, row decoder circuits 10 drive wordline drivers 15, which active the odd-numbered wordlines in memory array 1 (the memory array above row decoder circuits 10) and memory array 2 (the memory array adjacent memory array 1). Similarly, column decoder circuits 40 drive bitline drivers 45, which active the odd-numbered bit lines in memory array 4 (the memory array above column decoder circuits 40) and memory array 2 (the memory array adjacent memory array 4). Because a single set of wordline and bitline drivers is disposed between adjacent memory arrays, both wordlines and bitlines are continuous between adjacent memory arrays. For example, wordlines activated by wordline drivers 15 are continuous between memory arrays 1 and 2, and bitlines activated by bitline drivers 45 are continuous between memory arrays 1 and 4.

Figure 3:
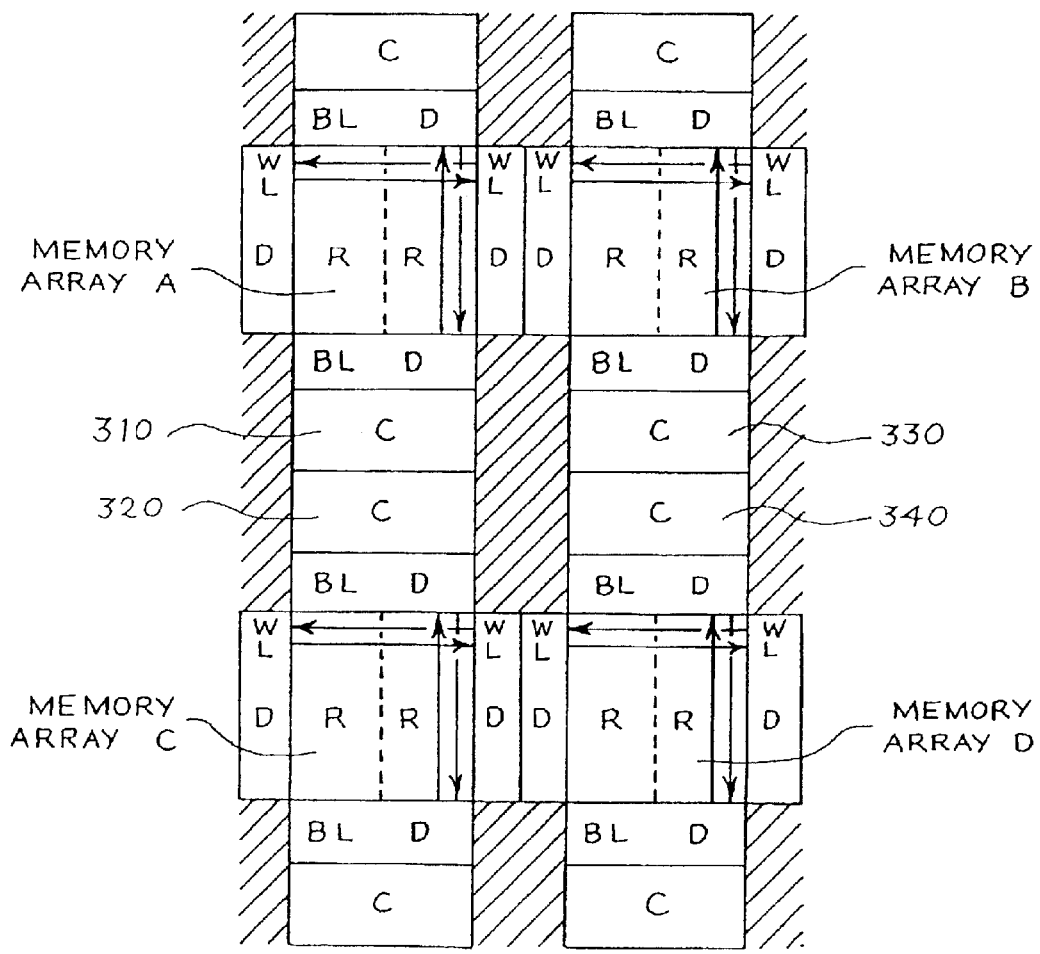
FIG. 3 is an illustration of a memory circuit arrangement in which only row decoder circuits are disposed under memory arrays.

The use of the checkerboard arrangement of column and row decoder circuits provides a denser support circuit arrangement as compared to prior approaches. Compare, for example, the memory circuit arrangement shown in FIG. 3 in which only row decoder circuits are disposed under the memory arrays. In this memory circuit arrangement, two sets of column decoder circuits are disposed between adjacent memory arrays: column decoder circuits 310 and 320 are disposed between memory arrays A and C, and column decoder circuits 330 and 340 are disposed between memory arrays C and D. In this design, there is no sharing of support circuitry between multiple memory arrays, and significantly less than 50% of the chip area is overlaid by memory arrays. In contrast, with the checkerboard arrangement of row and column decoder circuits in FIG. 1, the area on the memory chip overlaid by memory arrays is increased and could exceed 50%. The percentage occupied by memory arrays increases because the number of column decoder circuits is one half that in FIG. 3 for the same number of memory arrays. The area occupied by column decoder circuits and column sense circuits is under memory arrays (instead of adjacent the memory arrays), and the column decoder circuits support multiple memory arrays (instead of a single memory array). Accordingly, the wasted space between memory arrays is reduced because the memory arrays are closer together, separated only by connection area and not by column decoder circuits. Further, by sharing bitline drivers between memory arrays, the area occupied by memory array line connections is also reduced.

It should be noted that row decoder circuits and the column decoder circuits are arranged in a checkerboard pattern under a plurality of memory arrays even when there is a break in the checkerboard pattern (e.g., in the middle of the pattern). A partial checkerboard pattern can occur, for example, in memory designs of large numbers of memory arrays when there are independently-operating portions of the chip. Although a break in the checkerboard pattern wastes space because some decoder circuits will not have memory arrays overhead, many of the advantages of these preferred embodiments will still be achieved.

In the preferred embodiment shown in FIG. 1, there is one set of wordline drivers on the east and west sides of the memory arrays, and one set of bitline drivers on the north and south sides of the memory arrays. (The arrangement of circuits can be described in analogy to a map with north, east, south, and west directions.) Because a single set of bitline drivers is shared between adjacent memory arrays, bitlines are continuous between adjacent arrays. While the memory circuit arrangement shown in FIG. 1 reduces the area occupied by bitline drivers, only a subset of "stripes" of memory arrays can be selected during a read or write operation. For example, if the wordlines in stripes I and II were both selected, the sense amplifier in column decoder circuits 40 would read the data of the selected bitline in both memory array 1 and memory array 4. Since the data on a selected bitline is unique in each array, it is preferred that only one of two adjacent stripes be selected at once. Accordingly, a single stripe can be selected (e.g., only stripe 1) or alternating stripes can be selected (e.g., stripes 1 and 3). In the alternate embodiment shown in FIG. 4, two sets of bitline drivers are disposed between adjacent memory arrays, and bitlines are not continuous between the adjacent arrays. For example, there are two bitline drivers 410, 420 between memory arrays 1 and 4. The decoder 430 in one of the pair of column decoder circuits 440 under memory array 4 drives the two bitline drivers 410, 420. One sense amplifier 450 reads data from the bitline activated by one of the bitline drivers 410, and another sense amplifier 460 reads data from the bitline activated by the other bitline drivers 420. While this alternate embodiment uses twice as many bitline drivers and twice as many sense amplifiers in the column decoder circuits as compared to the embodiment shown in FIG. 1, this alternate embodiment provides the advantage of allowing every stripe of memory cells to be selected.

Figure 4:
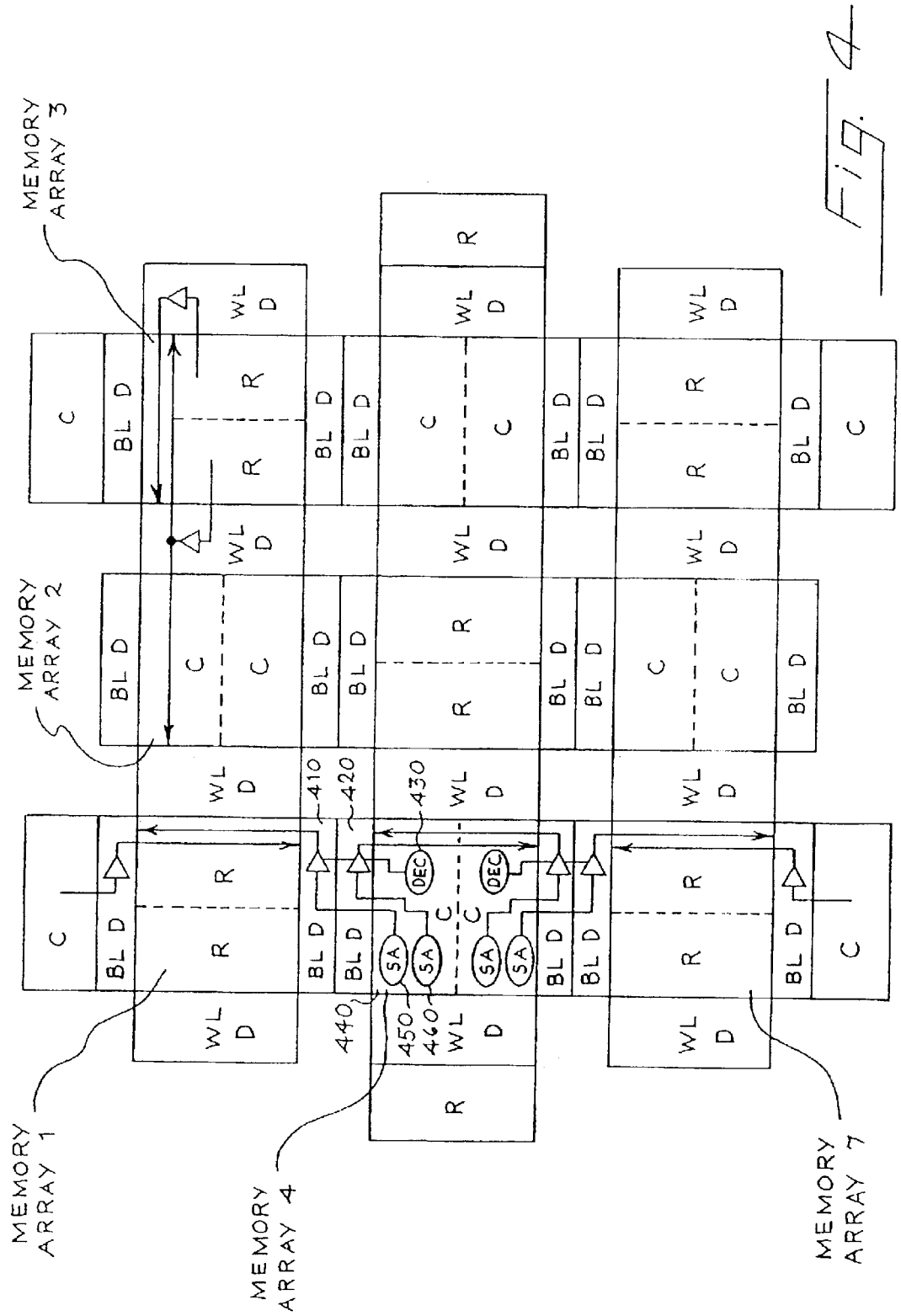
FIG. 4 is an illustration of a memory circuit arrangement of another preferred embodiment in which bitline drivers are not shared between adjacent memory arrays.
Figure 5:
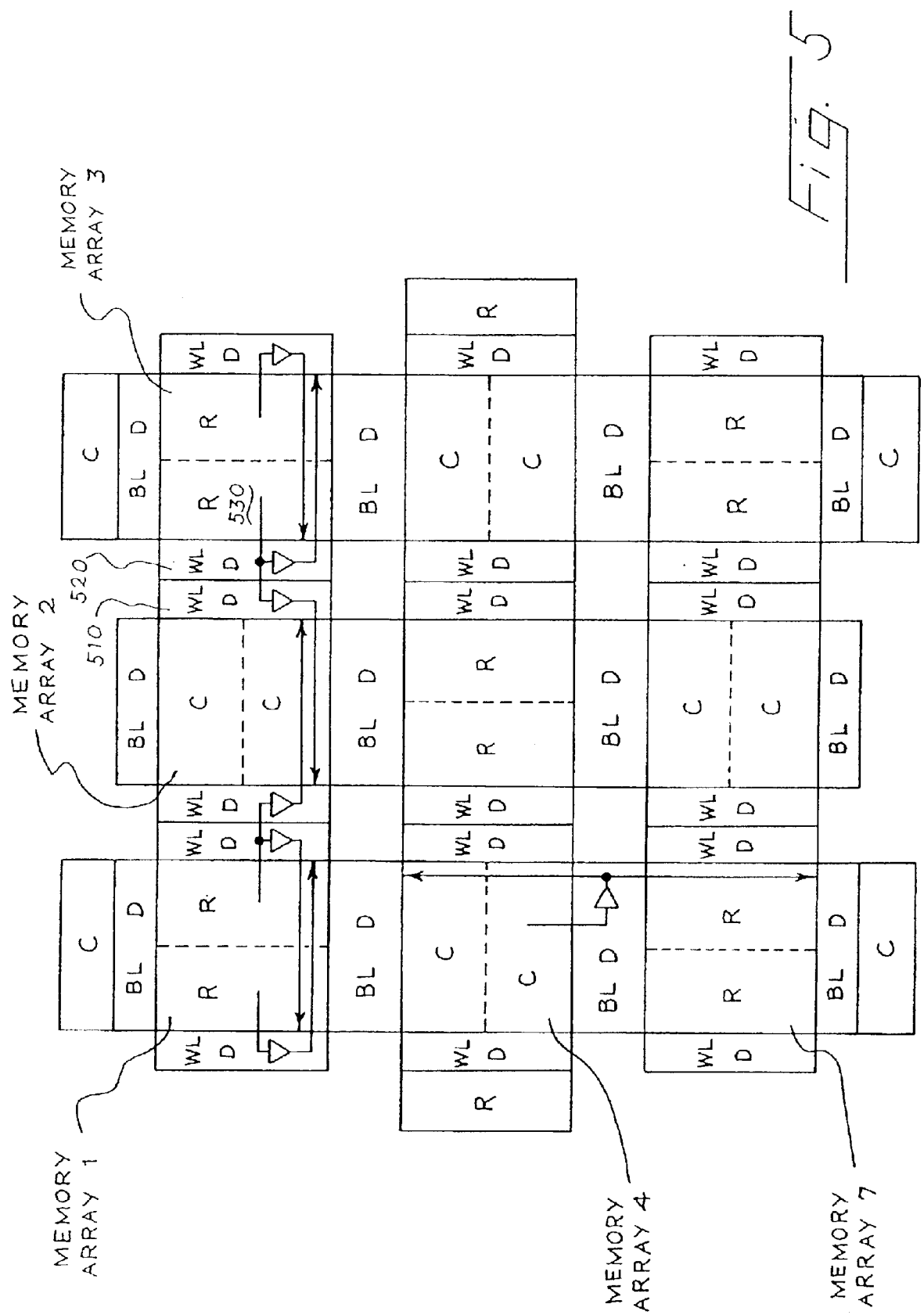
FIG. 5 is an illustration of a memory circuit arrangement of another preferred embodiment in which wordline drivers are not shared between adjacent memory arrays.

In the alternate embodiment shown in FIG. 4, the bitlines are not continuous between adjacent memory arrays since there are two sets of bitline drivers at the north and south sides of the memory arrays. However, the wordlines are continuous since there is one set of wordline drivers between adjacent memory arrays. This is shown by the wordlines in memory arrays 2 and 3. (Other wordlines and bitlines are not shown in this figure to simplify the drawing.) In another alternate embodiment, which is shown in FIG. 5, there is one set of bitline drivers between memory arrays (resulting in continuous bitlines), but two sets of wordline drivers between memory arrays (resulting in wordlines that are not continuous between memory arrays). This is shown, for example, by the two wordline drivers 510, 520 between memory arrays 2 and 3. One of the pair of row decoders circuits 530 under memory array 3 drives both sets of wordline drivers 510, 520. Wordline drivers 510 activate wordlines in memory array 2, while wordline drivers 520 activate wordlines in memory array 3. This alternate embodiment of breaking a continuous wordline into two wordlines may be preferred if long, continuous wordlines generate too much leakage current. In yet another alternate embodiment, there are two sets of bitline drivers as well as two sets of wordline drivers between adjacent memory arrays. In this alternate embodiment, neither bitlines nor wordlines are continuous between memory arrays.

Turning again to FIG. 1, both even and odd bitlines (and/or wordlines) of some of the memory arrays are driven by column decoder circuits (and/or row decoder circuits) disposed under the memory arrays. For example, the even and odd bitlines of memory array 4 are driven by both pairs of column decoder circuits under memory array 4. However, some memory arrays along the edge of the memory grid require decoder circuits that are not under the memory arrays. For example, while the odd bitlines of memory array 1 are driven by the column decoder circuits 40 under memory array 4, the even bitlines are driven by column decoder circuits 30, which are not disposed under a memory array. While the additional row and column decoder circuits are not disposed under memory cells in FIG. 1, it should be noted that memory cells can be stacked over the additional circuits. For example, column decoder circuits 30 can be disposed under memory arrays of an adjacent grid of memory arrays.

Figure 6:
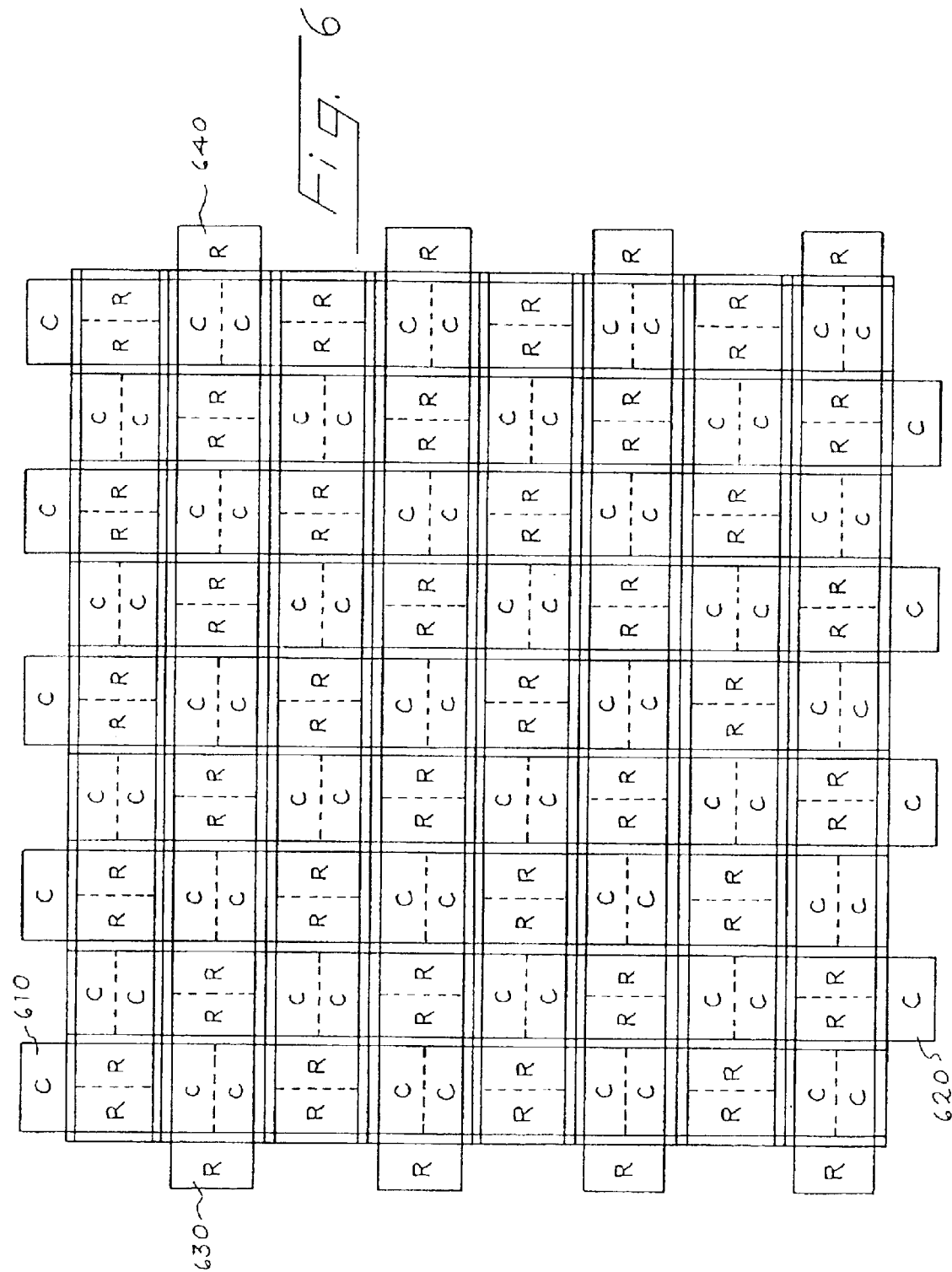
FIG. 6 is an illustration of a memory device of a preferred embodiment having extra column decoder circuits in alternate locations and extra row decoder circuits at the ends of the same stripe of memory arrays.

In the memory device of FIG. 1, additional row and column decoder circuits (such as column decoder circuits 30) are provided at half of the twelve edges of the three-by-three grid of memory arrays. In the three-by-three grid of memory arrays shown in FIG. 1, there are odd number of memory arrays in the stripes and columns of the grid, and the extra row and column decoder circuits are located the ends of the same stripe and column. For example, extra column decoder circuits 30, 50 are both at the ends of the first column in the grid, and extra row decoder circuits 55, 60 are both at the ends of stripe II. If there is an even number of memory arrays in the stripes (or the columns) of the grid, the extra decoders at the ends of the-columns (or the stripes) alternate locations. For example, in the memory device shown in FIG. 6, there are eight stripes and nine columns of memory arrays, and the extra column decoder circuits alternate locations while the extra row decoder circuits are both at the ends of the same stripe. (In the embodiment shown in FIG. 6, there are two sets of bitline drivers between adjacent memory arrays, while there is only a single set of wordlines drivers between adjacent memory arrays.)

The row and column connections in the wordline and bitline drivers can take any suitable form. For example, the row connections can be an inverter/driver or a switch connected to a voltage bus with its control input driven by the row decoder circuits. Similarly, the column connection can be a switch with its control input driven by the column decoder circuits and its input and output connected to a bitline and a sense amplifier circuit. Preferably, unselected voltage levels for the wordlines and bitlines are supplied by switches, which are not shown in FIG. 1 for simplicity. The connections to the wordlines and the bitlines between memory arrays are preferably multiple switches. By using multiple switches, the selected wordline voltage level and the unselected wordline voltage level can be made in the same connection area. An example of a preferred embodiment using multiple switches per each wordline decoder in a row decoder circuit is illustrated in FIG. 7.

Figure 7:
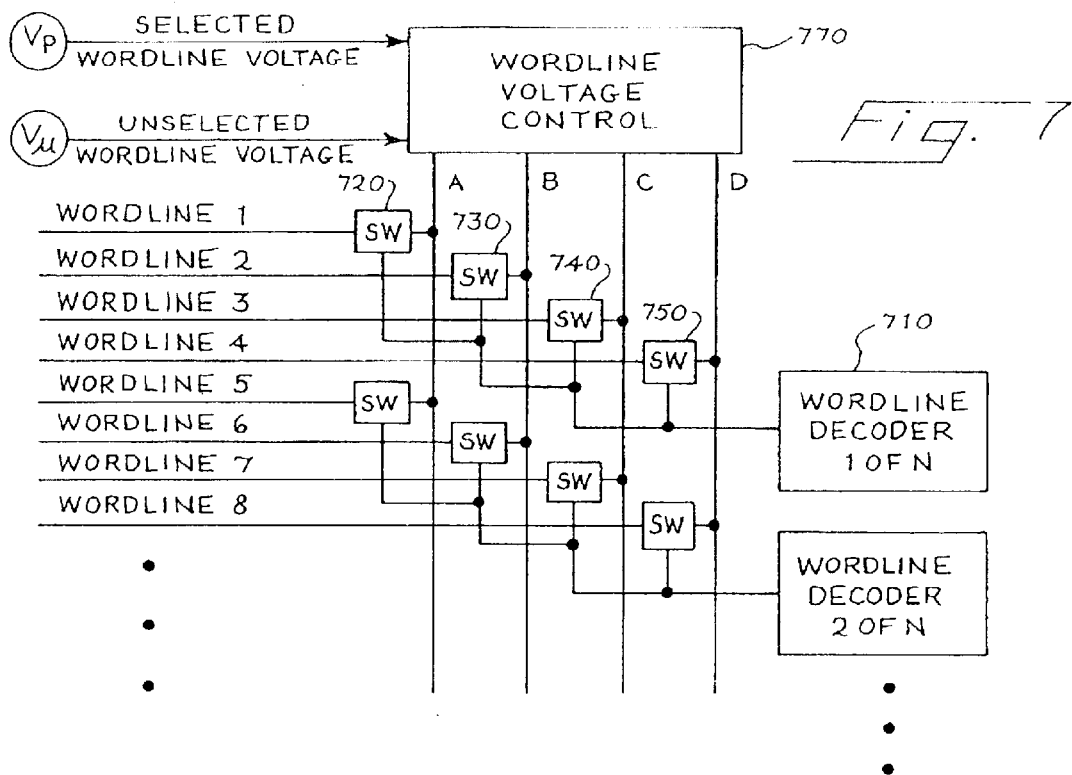
FIG. 7 is an illustration of a preferred embodiment in which multiple switches are used for each wordline decoder in a row decoder circuit.

In FIG. 7, a plurality of wordline decoders are used in each row decoder circuit, such as row decoder circuit 20 in FIG. 1. In this embodiment, there are N wordline decoders, and one wordline decoder is selected for a given memory address. Each of the N wordline decoders connects to four wordlines through four respective switches. In this way, each wordline decoder output controls multiple wordlines. For example, the output of wordline decoder 710 controls switches 720, 730, 740, and 750, which, in turn, control wordlines 1–4. The multiple switches are connected to different voltage level lines (lines A, B, C, and D) to provide unique wordline control, as described below. For very small cells such as possible with two terminal cells shown in FIG. 2, even more than four switches (e.g., 16 switches) are preferred. Four switches are illustrated in FIG. 7 for simplicity.

Figure 8:
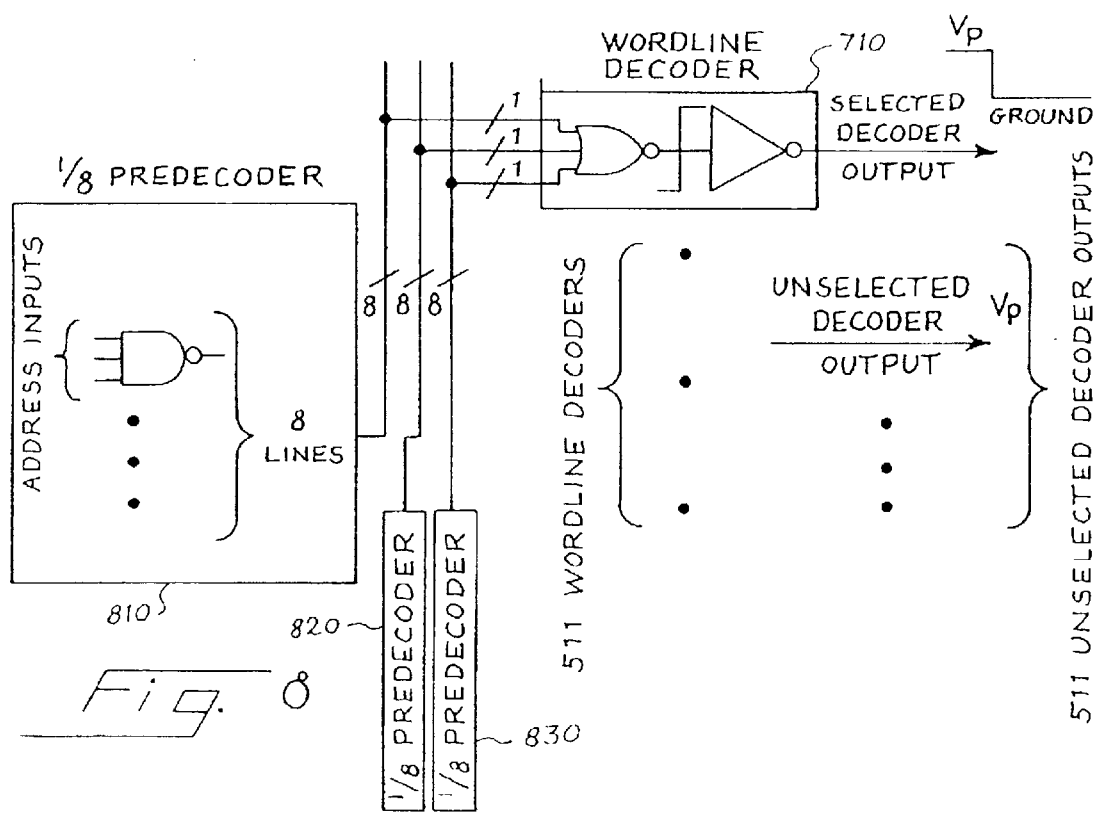
FIG. 8 is an illustration of wordline decoders and pre-decoders of a row decoder circuit of a preferred embodiment.

FIG. 8 is an illustration of wordline decoders and predecoders of row decoder circuitry of a preferred embodiment. In operation, a memory address is provided to ⅛ pre-decoders 810, 820, and 830, which provide input to N wordline decoders (here, 512 wordline decoders). One of the wordline decoders provides a selected decoder output, while the other wordline decoders provide an unselected decoder output. In this example, wordline decoder 710 provides a selected decoder output, while the other 511 wordline decoders provide an unselected decoder output. With reference to FIG. 7, a selected decoder output from wordline decoder 710 activates switches 720, 730, 740, and 750, and unselected decoder output from the other wordline decoders deactivates the remaining switches. The wordline voltage controller 770 connects the selected wordline voltage $V_p$, the unselected wordline voltage $V_u$, or a floating voltage to the four outputs A, B, C, and D. Through the use of the switches 720, 730, 740, 750, the selected wordline voltage $V_p$ is applied to one of the four wordlines, and the unselected wordline voltage $V_u$ or a floating voltage is applied to the other three wordlines. A similar arrangement can be used for bitlines, where lines A, B, C, and D are connected to a sense amplifier, an unselected bitline voltage, or a floating voltage. Each bitline decoder output would control multiple switches, which would connect to unique sense amplifier paths for unique bitline control.

In one preferred embodiment, the switches are multiple devices and each voltage level line A, B, C, and D comprises multiple lines, one line connected to each of the devices. Such an embodiment is shown in FIG. 9, where the switch 900 comprises a PMOS device 910 connected to a pull-up voltage and an NMOS device 920 connected to a pull-down voltage. FIG. 10 provides a table of wordline voltage control of a preferred embodiment where two of the pull-down lines have floating voltages. As mentioned above, the different voltages for selected and unselected wordlines and bitlines can be selected bias level, unselected bias level, or left floating. This and other preferred embodiments, which can be used alone or in combination with any of the preferred embodiments described herein, are set forth in "Passive Element Memory Array and Related Circuits Useful Therefor," U.S. patent application Ser. No. 60/277,815, which is hereby incorporated by reference. Other preferred embodiments that can be used alone or in combination with any of the preferred embodiments described herein are set forth in "Three-Dimensional Memory Array and Method of Fabrication," U.S. patent application Ser. No. 09/814,727 and "Three-Dimensional Memory Array," U.S. patent application Ser. No. 60/277,738, which are also hereby incorporated by reference.

FIG. 11 illustrates another preferred embodiment. In FIG. 11, half-density arrays with half the width of typical arrays (and one quarter the number of bits) are included at the ends of the stripes of the memory array. Column decoder circuits with half the number of columns are under these extra arrays. For example, half-density arrays 1100 and 1110 are included at the ends of stripe 1. Column decoder circuits 1120, 1130 are under half-density array 1100, and column decoder circuits 1140, 1150 are under half-density array 1110. Only half the wordlines in the half-density arrays can be selected because only one row decoder circuit/wordline decoder is adjacent the half-density arrays.

Lastly, it should be noted that any type of memory cell that allows row and column decoder circuits to be disposed under the memory arrays can be used. Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 to Knall, and U.S. patent application Ser. No. 09/638,428 to Johnson, each of which are hereby incorporated by reference. Specifically, an anti-fuse memory cell is preferred. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 256 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

On Mar. 21, 2001, the following U.S. patent applications were filed, each of which is hereby incorporated by reference: "Memory Device with Row and Column Decoder Circuits Arranged in a Checkerboard Pattern under a Plurality of Memory Arrays," U.S. Provisional Application No. 60/277,794; "Passive Element Memory Array and Related Circuits Useful Therefor," U.S. Provisional Application No. 60/277,815;"Three-Dimensional Memory Array," U.S. Provisional Application No. 60/277,738; and "Three-Dimensional Memory Array and Method of Fabrication," U.S. application Ser. No. 09/814,727.

On Jun. 29, 2001, the following U.S. patent applications were filed, each of which is hereby incorporated by reference: "Method and Apparatus for Writing Memory Arrays Using External Source of High Programming Voltage," U.S. patent application Ser. No. 09/897,785; "Three-Dimensional Memory Array Incorporating Serial Chain Diode Stack," U.S. patent application Ser. No. 09/897,705; "Method and Apparatus for Biasing Selected and Unselected Array Lines when Writing a Memory Array," U.S. patent application Ser. No. 09/897,771; "Memory Device with Row and Column Decoder Circuits Arranged in a Checkerboard Pattern under a Plurality of Memory Arrays," U.S. patent application Ser. No. 09/896,814; "Method and System for Increasing Programming Bandwidth in a Non-Volatile Memory Device," U.S. patent application Ser. No. 09/895,960; "Method and Apparatus for Discharging Memory Array Lines," U.S. patent application Ser. No. 09/897,784; "Current Sensing Method and Apparatus Particularly Useful for a Memory Array of Cells Having Diode-Like Characteristics," U.S. patent application Ser. No. 09/896,468; "Memory Array Incorporating Noise Detection Line," U.S. patent application Ser. No. 09/897,704; and "Memory Device and Method for Sensing while Programming a Non-Volatile Memory Cell," U.S. patent application Ser. No. 09/896,815.

The forgoing detailed description has described only a few of the many possible implementations of the present invention. For this reason, this detailed description is intended by way of illustration, and not by way of limitation. It is only the following claims, including all equivalents, that are intended to define the scope of this invention.

What is claimed is:

1. A memory device comprising:
   a plurality of memory arrays comprising a first memory array and a second memory array;
   a first circuit structure disposed beneath the first memory array, wherein the first circuit structure comprises all of the circuits disposed beneath the first memory array; and
   a second circuit structure, different from the first circuit structure, disposed beneath the second memory array, wherein the second circuit structure comprises all of the circuits disposed beneath the second memory array.

2. The memory device of claim 1, wherein the first circuit structure includes at least one row decoder circuit.

3. The memory device of claim 2, wherein the second circuit structure includes at least one column decoder circuit.

4. The memory device of claim 2, wherein the first circuit structure includes a second row decoder circuit.

5. The memory device of claim 1, wherein the second circuit structure includes at least one column decoder circuit.

6. The memory device of claim 5, wherein the first circuit structure includes at least one row decoder circuit.

7. The memory device of claim 5, wherein the second circuit structure includes a second column decoder circuit.

8. The memory device of claim 1, wherein the plurality of memory arrays comprise first and second sets of memory arrays, wherein the first circuit structure is disposed beneath each of the memory arrays in the first set, and wherein the second circuit structure is disposed beneath each of the memory arrays in the second set.

9. A memory device comprising:
a plurality of memory arrays disposed above a substrate;
a first decoder circuit associated with and largely disposed beneath a first memory array and also associated with a second memory array; and
a second decoder circuit.

10. The memory device of claim 9, wherein the second memory array is adjacent to the first memory array.

11. The memory device of claim 9, wherein the second decoder circuit is associated with and largely disposed beneath the first memory array and is also associated with a third memory array.

12. The memory device of claim 11, wherein the third memory array is adjacent to the first memory array.

13. The memory device of claim 9 further comprising a third decoder circuit associated with and largely disposed beneath a fourth memory array, said third decoder circuit also associated with the first memory array.

14. The memory device of claim 13, wherein the fourth memory array is adjacent to the first memory array.

15. The memory device of claim 13 further comprising a fourth decoder circuit associated with and largely disposed beneath a fifth memory array, said fourth decoder circuit also associated with the first memory array.

16. The memory device of claim 15, wherein the fifth memory array is adjacent to the first memory array.

17. The memory device of claim 9 further comprising a group of array line driver circuits associated with the first decoder circuit, said group associated with the first memory array and the second memory array.

18. The memory device of claim 9 further comprising two groups of array line driver circuits associated with the first decoder circuit, one such group associated with the first memory array and the other such group associated with the second memory array.

19. The memory device of claim 9, wherein the first decoder circuit comprises a column decoder circuit.

20. The memory device of claim 9, wherein the first decoder circuit comprises a row decoder circuit.

21. The memory device of claim 20, wherein the row decoder circuit further comprises a first group of word line driver circuits associated with word lines within the first memory array and a second group of word line driver circuits associated with word lines within the second memory array, whereby word lines are discontinuous between the first and second memory arrays.

22. The memory device of claim 9 further comprising an additional plurality of memory arrays vertically-stacked above the first-mentioned plurality of memory arrays.

23. The memory device of claim 11 wherein the first memory array comprises first and second sets of array lines of like kind, wherein the first set of array lines is associated with the first decoder circuit and the second set of array lines is associated with the second decoder circuit, and wherein the array lines of the first set are interleaved with the array lines of the second set.

24. The memory device of claim 23 wherein the first set of array lines and the second set of array lines are driven from opposites sides of the first memory array.

25. A memory device comprising:
a plurality of memory arrays;
a plurality of row decoder circuits; and
a plurality of column decoder circuits;
wherein at least one of the plurality of row or column decoder circuits is associated with a memory array above its location and an adjacent memory array.

26. The memory device of claim 25, wherein at least one of the plurality of row decoder circuits is associated with a memory array above its location and an adjacent memory array; and further comprising only one set of word line drivers between adjacent memory arrays, whereby word lines are continuous between said adjacent memory arrays.

27. The memory device of claim 25, wherein at least one of the plurality of row decoder circuits is associated with a memory array above its location and an adjacent memory array; and further comprising two sets of word line drivers between adjacent memory arrays, whereby word lines are not continuous between said adjacent memory arrays.

28. The memory device of claim 25, wherein at least one of the plurality of column decoder circuits is associated with a memory array above its location and an adjacent memory array; and further comprising only one set of bit line drivers between adjacent memory arrays, whereby bit lines are continuous between said adjacent memory arrays.

29. The memory device of claim 25, wherein at least one of the plurality of column decoder circuits is associated with a memory array above its location and an adjacent memory array; and further comprising two sets of bit line drivers between adjacent memory arrays, whereby bit lines are not continuous between said adjacent memory arrays.

30. The memory device of claim 25, wherein at least one row decoder circuit comprises a plurality of word line decoders, and wherein at least one word line decoder is connected to control an associated plurality of word lines.

31. The memory device of claim 30 wherein said at least one word line decoder is coupled to an associated plurality of word line drivers.

32. The memory device of claim 31 wherein each word line driver comprises a switch device arranged to couple the respective word line to an associated bias line.

33. The memory device of claim 31 wherein each word line driver comprises two devices arranged to couple the respective word line to either of two associated bias lines.

34. The memory device of claim 25 further comprising an additional plurality of memory arrays vertically-stacked above the first-mentioned plurality of memory arrays.

35. The memory device of claim 25 wherein a first memory array of said plurality of memory arrays comprises first and second sets of array lines of like kind, wherein the first set of array lines is associated with a first decoder circuit, and the second set of array lines is associated with a second decoder circuit, and wherein the array lines of the first set are interleaved with the array lines of the second set.

36. The memory device of claim 35 wherein the first set of array lines and the second set of array lines are driven from opposites sides of the first memory array.

37. The memory device of claim 35 wherein the first decoder circuit and the second decoder circuit are disposed beneath the first memory array.

38. The memory device of claim 25, wherein the plurality of memory arrays comprise a plurality of semiconductor-based memory cells.

39. The memory device of claim 25, wherein the plurality of memory arrays comprise a plurality of anti-fuse memory cells.

40. The memory device of claim 25, wherein the plurality of memory arrays comprise a plurality of write-once memory cells.

41. The memory device of claim 25, wherein the plurality of memory arrays comprise memory cells formed at least in part by railstacks.

42. A memory device comprising:

a plurality of memory arrays;

a plurality of row decoder circuits; and a plurality of column decoder circuits;

wherein the row decoder circuits and the column decoder circuits are arranged under the plurality of memory arrays such that any given memory array is either above a row decoder circuit or a column decoder circuit, but not both;

wherein at least one column decoder circuit comprises a plurality of bitline decoders, and wherein the plurality of bitline decoders are connected to a respective plurality of bitlines through a respective plurality of switches.

43. A memory device comprising:

a plurality of memory arrays;

a plurality of row decoder circuits; and a plurality of column decoder circuits;

wherein the row decoder circuits and the column decoder circuits are arranged under the plurality of memory arrays such that under any two adjacent memory arrays, there is exactly one row decoder circuit and exactly one column decoder circuit;

wherein at least one column decoder circuit comprises a plurality of bitline decoders, and wherein the plurality of bitline decoders are connected to a respective plurality of bitlines through a respective plurality of switches.

44. A memory device comprising:

a plurality of memory arrays;

a plurality of row decoder circuits; and a plurality of column decoder circuits;

wherein the row decoder circuits and the column decoder circuits are arranged under the plurality of memory arrays such that for two adjacent memory arrays, there is a row decoder circuit but not a column decoder circuit under one of the two adjacent memory arrays and there is a column decoder circuit but not a row decoder circuit under the other of the two adjacent memory arrays;

wherein at least one column decoder circuit comprises a plurality of bitline decoders, and wherein the plurality of bitline decoders are connected to a respective plurality of bitlines through a respective plurality of switches.

45. A memory device comprising:

a plurality of memory arrays;

a plurality of row decoder circuits; and a plurality of column decoder circuits;

wherein a row decoder circuit defines four sides, and wherein the row decoder circuits and the column decoder circuits are arranged under the plurality of memory arrays such that for at least one row decoder circuit, there is a column decoder circuit on each of the four sides;

wherein at least one column decoder circuit comprises a plurality of bitline decoders, and wherein the plurality of bitline decoders are connected to a respective plurality of bitlines through a respective plurality of switches.

46. A memory device comprising:

a plurality of memory arrays;

a plurality of row decoder circuits; and a plurality of column decoder circuits;

wherein a column decoder circuit defines four sides, and wherein the row decoder circuits and the column decoder circuits are arranged under the plurality of memory arrays such that for at least one column decoder circuit, there is a row decoder circuit on each of the four sides;

wherein at least one column decoder circuit comprises a plurality of bitline decoders, and wherein the plurality of bitline decoders are connected to a respective plurality of bitlines through a respective plurality of switches.

47. A memory device comprising:

a plurality of memory arrays;

a plurality of row decoder circuits; and a plurality of column decoder circuits;

wherein the row decoder circuits and the column decoder circuits are arranged under the plurality of memory arrays such that any given memory array is either above a row decoder circuit or a column decoder circuit, but not both;

wherein the memory cells of the plurality of memory arrays comprise one of the following: a semiconductor material, an organic polymer, a phase change material, and an amorphous solid.

48. A memory device comprising:

a plurality of memory arrays;

a plurality of row decoder circuits; and a plurality of column decoder circuits;

wherein the row decoder circuits and the column decoder circuits are arranged under the plurality of memory arrays such that under any two adjacent memory arrays, there is exactly one row decoder circuit and exactly one column decoder circuit;

wherein the memory cells of the plurality of memory arrays comprise one of the following: a semiconductor material, an organic polymer, a phase change material, and an amorphous solid.

49. A memory device comprising:

a plurality of memory arrays;

a plurality of row decoder circuits; and a plurality of column decoder circuits;

wherein the row decoder circuits and the column decoder circuits are arranged under the plurality of memory arrays such that for two adjacent memory arrays, there is a row decoder circuit but not a column decoder circuit under one of the two adjacent memory arrays and there is a column decoder circuit but not a row decoder circuit under the other of the two adjacent memory arrays;

wherein the memory cells of the plurality of memory arrays comprise one of the following: a semiconductor material, an organic polymer, a phase change material, and an amorphous solid.

50. A memory device comprising:

a plurality of memory arrays;

a plurality of row decoder circuits; and a plurality of column decoder circuits;

wherein a row decoder circuit defines four sides, and wherein the row decoder circuits and the column decoder circuits are arranged under the plurality of memory arrays such that for at least one row decoder circuit, there is a column decoder circuit on each of the four sides;

wherein the memory cells of the plurality of memory arrays comprise one of the following: a semiconductor material, an organic polymer, a phase change material, and an amorphous solid.

51. A memory device comprising:

a plurality of memory arrays;

a plurality of row decoder circuits; and a plurality of column decoder circuits;

wherein a column decoder circuit defines four sides, and wherein the row decoder circuits and the column decoder circuits are arranged under the plurality of memory arrays such that for at least one column decoder circuit, there is a row decoder circuit on each of the four sides;

wherein the memory cells of the plurality of memory arrays comprise one of the following: a semiconductor material, an organic polymer, a phase change material, and an amorphous solid.

* * * * *